United States Patent
Morimoto

(10) Patent No.: US 7,688,614 B2
(45) Date of Patent: Mar. 30, 2010

(54) NONVOLATILE SEMICONDUCTOR MEMORY DEVICE

(75) Inventor: Hidenori Morimoto, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/084,556

(22) PCT Filed: Nov. 1, 2006

(86) PCT No.: PCT/JP2006/321817

§ 371 (c)(1),
(2), (4) Date: May 5, 2008

(87) PCT Pub. No.: WO2007/069405

PCT Pub. Date: Jun. 21, 2007

(65) Prior Publication Data

US 2009/0097295 A1    Apr. 16, 2009

(30) Foreign Application Priority Data

Dec. 16, 2005    (JP)    ............... 2005-362646

(51) Int. Cl.
*G11C 11/00*    (2006.01)

(52) U.S. Cl. ............. 365/148; 365/189.06; 365/189.09; 365/189.11

(58) Field of Classification Search ................ 365/148, 365/51, 175, 189.06, 189.09, 189.011
See application file for complete search history.

(56) References Cited

U.S. PATENT DOCUMENTS

| | | | |
|---|---|---|---|
| 5,268,864 A | 12/1993 | Fujita et al. | |
| 5,341,325 A | 8/1994 | Nakano et al. | |
| 5,894,447 A * | 4/1999 | Takashima | ............... 365/158 |
| 6,151,241 A | 11/2000 | Hayashi et al. | |
| 6,753,561 B1 | 6/2004 | Rinerson et al. | |

(Continued)

FOREIGN PATENT DOCUMENTS

EP    1 560 221 A2    8/2005

(Continued)

OTHER PUBLICATIONS

International Search Report for PCT/JP2006/321817 dated Jan. 23, 2007.

(Continued)

*Primary Examiner*—Hoai V Ho
*Assistant Examiner*—Jay Radke
(74) *Attorney, Agent, or Firm*—Nixon & Vanderhye P.C.

(57) ABSTRACT

A nonvolatile semiconductor memory device can prevent memory characteristics from deteriorating due to IR drop on word or bit lines in a cross-point type memory cell array. The device comprises a word line selection circuit selecting a selected word line from word lines and applying selected and unselected word line voltages to the selected and unselected word lines, respectively, a bit line selection circuit selecting a selected bit line from bit lines and applying selected and unselected bit line voltages to the selected and unselected bit lines, respectively, and voltage control circuits preventing voltage fluctuation of at least either one of the word and bit lines, wherein at least either one of the word and bit lines are connected to the voltage control circuits at a voltage control point positioned at a farthest point from a drive point connected to the word line selection circuit or bit line selection circuit.

19 Claims, 13 Drawing Sheets

U.S. PATENT DOCUMENTS

| | | |
|---|---|---|
| 6,853,599 B2 * | 2/2005 | Oh et al. .................... 365/158 |
| 7,558,099 B2 | 7/2009 | Morimoto |
| 2002/0001243 A1 | 1/2002 | Pochmuller |
| 2004/0160819 A1 | 8/2004 | Rinerson et al. |
| 2004/0202041 A1 * | 10/2004 | Hidenori .................... 365/233 |
| 2004/0257864 A1 | 12/2004 | Tamai et al. |
| 2005/0036376 A1 * | 2/2005 | Iwata et al. ................. 365/202 |
| 2005/0040482 A1 | 2/2005 | Suzuki et al. |
| 2005/0195001 A1 * | 9/2005 | Motz .......................... 327/143 |
| 2009/0052225 A1 | 2/2009 | Morimoto |

FOREIGN PATENT DOCUMENTS

| | | |
|---|---|---|
| JP | 64-079997 | 3/1989 |
| JP | 04-113596 | 4/1992 |
| JP | 2002-056666 | 2/2002 |
| JP | 2005-032401 | 2/2005 |

OTHER PUBLICATIONS

Chen et al.: "An access-transistor-free (0T/1R) non-volatile resistance random access memory (RRAM) using a novel threshold switching, self-rectifying chalcogenide device," IEDM, 2003, pp. 905-908.

Li et al.: "Evaluation of $SiO_2$ Antifuse in a 3D-OTP Memory," IEEE, 2004, pp. 416-421.

Zhuang et al.: "Novell Colossal Magnetoresistive Thin Film Non-volatile Resistance Random Access Memory (RRAM)," IEEE, 2002, four pages.

Baek et al.: "Highly Scalable Non-volatile Resistive Memory Using Simply Binary Oxide Driven by Asymmetric Unipolar Voltage Pulses," IEEE, 2004, four pages.

Ahn et al.; "Highly Manufacturable High Density Phase Change Memory of 64 Mb and Beyond," IEEE, 2004, four pages.

Sakimura et al., "A 512Kb Cross-Point Cell MRAM," ISSCC Digest of Technical Papers, pp. 130-131, 2003, 8 pages with figure details.

Supplementary European Search Report dated Jul. 30, 2009 (6 pages).

* cited by examiner

| Position of Selected Memory Cell | Word Line Voltage (V) | |
|---|---|---|
| | Voltage control circuit is provided (A) | Voltage control circuit is not provided (B) |
| C1 Side | 1.85 | 2.03 |
| Center | 1.85 | 1.89 |
| D1 Side | 1.66 | 1.66 |

Fig. 9

NONVOLATILE SEMICONDUCTOR MEMORY DEVICE

CROSS-REFERENCE TO RELATED APPLICATIONS

This application is a National Phase filing under 35 U.S.C. §371 of International Application No. PCT/JP2006/321817 filed on Nov. 1, 2006, and which claims priority to Japanese Patent Application No. 2005-362646 filed on Dec. 16, 2005.

TECHNICAL FIELD

The present invention relates to a nonvolatile semiconductor memory device having a cross-point type memory cell array in which a plurality of two-terminal structured memory cells are disposed in a row direction and a column direction, a plurality of word lines extend in the row direction, a plurality of bit lines extend in the column direction, one ends of the memory cells connected to the same row are connected to the common word line, and the other ends thereof connected to the same column are connected to the common bit line.

BACKGROUND ART

As an integrated circuit and the function of a computer are improved, a new application requiring a function for storing large amount of data has been being developed. There is an application requiring a nonvolatile semiconductor memory device having a function for electrically programming data and erasing stored data. Many applications become applicable by lowering the cost of making a nonvolatile semiconductor memory device per megabyte to less than one U.S. dollar. For example, there are alternative applications for (1) a chemical film for storing a photographic image (photographic film), (2) a compact disk (CD) for storing music data and text data for distribution, (3) a digital versatile disk (DVD) for storing video data and multimedia data for distribution, and (4) a magnetic tape such as a digital audiotape and videotape for storing audio and video data by audience.

The above conventional memory medium is a nonvolatile memory and stored in an archive (a storage case and the like) and can be removed from a main device and all power supplies for about ten years or more while the information recorded therein is kept so as not to be completely destroyed substantially. The nonvolatile semiconductor memory device is required to hold its data over a long period of time as with the CD, DVD, magnetic tape and almost all types of photographic films.

A nonvolatile semiconductor memory device that can be substituted for the conventional memory medium is a flash memory, EEROM and the like in which data can be electrically erased and programmed as of the moment. Unfortunately, according to the nonvolatile semiconductor memory device at present, memory cells are arranged on a monocrystalline silicon substrate two-dimensionally in general, and confined to a two-dimensional memory cell array. Therefore, the data amount that can be stored (memory capacity) is limited to the number of memory cells that can be formed in a single plane of the silicon substrate.

Meanwhile, according to a three-dimensional semiconductor memory device, since memory cell arrays are laminated on the substrate surface vertically, memory capacity per unit area is increased and the manufacturing cost per bit can be reduced. A three-dimensional semiconductor memory device disclosed in the following non-patent document 1 is a 3D-OTP (one time programmable) nonvolatile memory device in which memory cell arrays are laminated on a substrate surface vertically. Cross-point type memory cell arrays in which memory elements are disposed at intersection points of word lines and bit lines are laminated vertically to provide a four-layer structure.

According to the non-patent document 1, the film of the memory element is formed of polycrystalline silicon. A memory cell area per bit is $4F^2$. Here, "F" designates a minimum design dimension defined by a manufacturing process to be used. The memory cell area is equal to that of a flash memory having the same design rule. However, since the memory cell arrays have the four-layer structure in the three-dimensional semiconductor memory device, an effective cell area is $1F^2$ that is a quarter of $4F^2$. Therefore, the manufacturing cost can be reduced as compared with the flash memory. Each memory cell constituting the memory cell array is formed such that a state change part called "anti-fuse" and a selection part made up of a diode are connected in series and the ends of the memory cell are connected to a word line and a bit line, respectively. The anti-fuse is made of a silicon oxide film, and the diode is formed by laminating P-type silicon and N-type silicon. Data is stored using the resistance change of the anti-fuse when a voltage is applied to the memory cell. The anti-fuse is in a high insulating state initially and changed into a conductive state when the threshold voltage or more is applied. When the anti-fuse becomes the conductive state once, since it does not return to the insulating state, programming can be performed only one film. The diode is provided to prevent the current flowing in the selected memory cell from leaking.

Meanwhile, as the memory cell that can be employed in the cross-point type memory cell array in which two-terminal structured memory cells are arranged at the intersection points (cross points) of the word lines and the bit lines, various kinds of nonvolatile memory cells can be used other than the above anti-fuse provided with the diode regardless of whether the memory cell array has the two-dimensional structure or the three-dimensional structure. For example, it includes a memory cell formed of a transition metal oxide such as PrCaMnO or NiO that changes its resistance by an electric stress disclosed in the following non-patent document 2 and non-patent document 3, or formed of a phase change material such as GeSeTe that changes its phase by a thermal stress caused by a current disclosed in the following non-patent document 4, and a memory cell in which the above memory element material and a diode are connected in series.

Non-patent document 1: Feng Li et al., "Evaluation of SiO2 Antifuse in a 3D-OTP Memory", IEEE Transactions on Device and Material Reliability Vol. 4 No. 3 (2004) pp. 416-421

Non-patent document 2: W. W. Zhuang et al., "Novell Colossal Magnetoresistive Thin Film Nonvolatile Resistance Random Access memory (RRAM)", IEDM Technical Digest, pp. 193-196, December 2002

Non-patent document 3: I. G. Beak et al., "Highly scalable non-volatile resistive memory using simple binary oxide driven by asymmetric unipolar voltage pulses", IEDM Technical Digest, pp. 587-590, December, 2004

Non-patent document 4: S. J. Ahn et al., "Highly manufacturable high density phase change memory of 64 Mb and beyond", IEDM Technical Digest, pp. 907-910, December 2004

SUMMARY

However, according to the above three-dimensional semiconductor memory device, since the formation of the memory cell array and the formation of the layer of wiring such as the word line and bit line are repeated alternately, the wiring layer is formed of polycrystalline silicon that is stable against heat or high melting point metal material in general. Since the above wiring material has a high resistance value as compared with aluminum and copper, voltage levels applied to the memory cell are different between the side closer to a selection circuit for selecting the word line and bit line and the side further apart from it because of an IR drop (voltage drop or voltage rise) caused by a programming current and wiring resistance. In this case, the problem is that the resistance values after programming largely vary. In addition, even in the case where the memory cell array has the two-dimensional structure, when the programming current is large, the same problem arises.

One or more aspects of the present invention address the above problem and others. It is an object of one or more aspects of the present invention to provide a nonvolatile semiconductor memory device capable of preventing memory characteristics from deteriorating due to an IR drop on the word line and bit line of the cross-point type memory cell array.

MEANS FOR SOLVING THE PROBLEM

A nonvolatile semiconductor memory device according to a non-limiting embodiment of the present invention includes a memory cell array having a plurality of two-terminal structured memory cells disposed in a row direction and a column direction, a plurality of word lines extending in the row direction, and a plurality of bit lines extending in the column direction, in which one ends of the memory cells in the same row are connected to the common word line and the other ends of the memory cells in the same column are connected to the common bit line, and it is characterized as first characteristics by further including a word line selection circuit selecting a predetermined number of word lines from the plurality of word lines as selected word lines, and applying a selected word line voltage and an unselected word line voltage to the selected word lines and unselected word lines, respectively, a bit line selection circuit selecting a predetermined number of bit lines from the plurality of bit lines as selected bit lines, and applying a selected bit line voltage and an unselected bit line voltage to the selected bit lines and unselected bit lines, respectively, and a voltage control circuit preventing the voltage fluctuation of at least either one of the plurality of word lines and the plurality of bit lines, in which at least either one of the plurality of word lines and the plurality of bit lines are connected to the voltage control circuit at a voltage control point positioned at a farthest point from a drive point at which the plurality of word lines are connected to the word line selection circuit or the plurality of bit lines are connected to the bit line selection circuit, or at a middle point between the drive point and the farthest point.

According to a non-limiting embodiment of the nonvolatile semiconductor memory device having the first characteristics, since the voltage control circuit prevents voltage fluctuation on the word line and/or bit line connected to the voltage control circuit at the voltage control point apart from the drive point at which the word line and/or bit line is driven by the word line selection circuit and/or the bit line selection circuit, voltage drop or voltage rise due to a current flowing in wiring resistance between the drive point and the selected memory cell to be a target of a memory operation is prevented, so that memory characteristics can be prevented from deteriorating due to the voltage drop or voltage rise.

For example, in the case where the memory cell is constituted such that information can be programmed when electric stress is applied to both ends of a variable resistance element and the electric resistance of the variable resistor element is changed, although the voltage applied to the selected memory cell fluctuates depending on the position of the selected memory cell on the word line or bit line, due to the voltage drop or the voltage rise caused by the program current flowing in the selected memory cell and the wiring resistance, since this voltage fluctuation is prevented by the voltage control circuit and a variation in resistance value (memory characteristics) after programming depending on the position of the selected memory cell can be prevented. Thus, since the variation of the memory characteristics after programming can be prevented, a high precision reading operation can be implemented.

A non-limiting embodiment of the nonvolatile semiconductor memory device having the first characteristics can be characterized as having second characteristics in that one ends of at least either one of the plurality of word lines and the plurality of bit lines are connected to the word line selection circuit or the bit line selection circuit, and the other ends thereof are connected to the voltage control circuit.

According to a non-limiting embodiment of the nonvolatile semiconductor memory device having the second characteristics, since the voltage control circuit is connected at the farthest point where the voltage drop or the voltage rise due to the current flowing through the wiring resistance between the drive point and selected memory cell to be a target of the memory operation becomes maximum in the case where the selected memory cell is positioned at the farthest point of the word line or bit line, the voltage fluctuation can be most effectively prevented and the effect of the nonvolatile semiconductor memory device having the first characteristics can be achieved to its maximum.

A non-limiting embodiment of the nonvolatile semiconductor memory device having the first or second characteristics can be characterized as having third characteristics in that the voltage control circuit includes a diode circuit to prevent the voltage fluctuation in a positive direction or a negative direction at the voltage control point from a predetermined control reference voltage.

A non-limiting embodiment of the nonvolatile semiconductor memory device having the third characteristics can be characterized as having fourth characteristics in that the voltage control circuit includes a series circuit having the diode circuit and a MOSFET, and an inverter circuit, the series circuit is connected between the voltage control point and a predetermined voltage supply line, the input terminal of the inverter circuit is connected to the drain electrode or the source electrode of the MOSFET, whichever is on the side of the voltage control point, and the output terminal of the inverter circuit is connected to the gate electrode of the MOSFET.

A non-limiting embodiment of the nonvolatile semiconductor memory device having the third or fourth characteristics can be further characterized as having fifth characteristics in that the diode circuit includes a PN junction diode element.

A non-limiting embodiment of the nonvolatile semiconductor memory device having the third or fourth characteristics can be further characterized as having sixth characteristics in that the diode circuit includes a MOSFET having the drain and gate which are connected to each other.

A non-limiting embodiment of the nonvolatile semiconductor memory device having the first or second characteristics can be further characterized as seventh characteristics in that the voltage control circuit includes a MOSFET having the drain connected to the voltage control point and the source connected to a predetermined voltage supply line, and an inverter circuit having the input terminal connected to the voltage control point and the output terminal connected to the gate of the MOSFET.

According to a non-limiting embodiment of the nonvolatile semiconductor memory device having the third to seventh characteristics, the voltage control circuit achieving the effect of the nonvolatile semiconductor memory device having the first characteristics can be specifically implemented. Especially, when the voltage control circuit includes the diode circuit, only large voltage fluctuation can be selectively prevented by adjusting the voltage at both ends when the diode circuit is turned on. Thus, this is useful in the case where it is preferable that small voltage fluctuation is not to be prevented in a specific memory operation. In addition, when the MOSFET and the inverter circuit having the output terminal connected to the gate of the MOSFET are provided, since the on-off of the voltage control circuit can be controlled according to the voltage level of the input terminal of the inverter circuit, in the case where the voltage applied to the selected word line or the selected bit line varies depending on the kind of the memory cell operation, only the voltage fluctuation on the selected word line or the selected bit line can be selectively prevented in a specific memory operation.

A non-limiting embodiment of the nonvolatile semiconductor memory device having any one of the above characteristics can be further characterized as having eighth characteristics in that the memory cell has a two-terminal structure having a variable resistance element storing information by the change of an electric resistance, in which the information can be programmed when an electric stress is applied to both ends of the variable resistance element and the electric resistance of the variable resistance element is changed, and when a predetermined program voltage is applied between the selected word line and the selected bit line connected to the memory cell to be programmed at the time of programming operation, in the ease where the voltage control circuit is connected to the selected word line or the selected bit line, whichever is supplied with a higher voltage, the voltage control circuit prevents voltage fluctuation in a direction toward a low voltage at the voltage control point, or in the case where the voltage control circuit is connected to the selected word line or the selected bit line, whichever is supplied with a lower voltage, the voltage control circuit prevents voltage fluctuation in a direction toward a high voltage at the voltage control point.

According to a non-limiting embodiment of the nonvolatile semiconductor memory device having the eighth characteristics, when the voltage applied to the selected memory cell fluctuates depending on the position of the selected memory cell on the word line or the bit line due to the voltage drop or the voltage rise caused by a program current flowing in the selected memory cell and wiring resistance, the voltage control circuit prevents the voltage fluctuation specifically to prevent the variation in resistance value (memory characteristics) after programming depending on the position of the selected memory cell. Thus, since the variation in the memory characteristics after programming can be prevented, high precision reading operation can be performed.

A non-limiting embodiment of it nonvolatile semiconductor memory device having any one of the above characteristics can be further characterized as having ninth characteristics in that the memory cell has a two-terminal structure having a variable resistance element storing information by the change of an electric resistance, in which the information can be programmed when an electric stress is applied to both ends of the variable resistance element and the electric resistance of the variable resistance element is changed, and the voltage control circuit is not activated at the time of reading operation of the memory cell.

According to a non-limiting embodiment of the nonvolatile semiconductor memory device having the ninth characteristics, at the time of reading operation, since a current flowing in the voltage control circuit at the time of voltage fluctuation control is superimposed on a read current flowing in the selected memory cell to be read, the high precision reading operation is not hindered.

A non-limiting embodiment of the nonvolatile semiconductor memory device having any one of the above characteristics can be further characterized as having tenth characteristics in that the voltage control circuit is constituted so as not to prevent the fluctuation of the voltage applied to each of the unselected word lines or the unselected bit lines.

According to a non-limiting embodiment of the nonvolatile semiconductor memory device having the tenth characteristics, when the voltage control circuit is constituted so as to prevent the fluctuation of the selected word line voltage or the selected bit line voltage applied to the selected word line or the selected bit line, the unselected word line voltage or the unselected bit line voltage applied to the unselected word line or the unselected bit line is prevented from being erroneously determined as the fluctuation from the selected word line voltage or the selected bit line voltage, so that the unselected word line voltage or the unselected bit line voltage is appropriately applied to the unselected word line or the unselected bit line, whereby the memory operation can be appropriately performed.

A non-limiting embodiment of the nonvolatile semiconductor memory device having any one of the above characteristics is can be further characterized as eleventh characteristics in that at least either one of the plurality of word lines and the plurality of bit lines are formed of a high melting point metal material, polycrystalline silicon, or a compound of the high melting point metal material and polycrystalline silicon.

According to the nonvolatile semiconductor memory device having the eleventh characteristics, when the word line or the bit line is formed of a high melting point metal material, polycrystalline silicon, or a compound of the high melting point metal material and polycrystalline silicon, although the wiring resistance thereof is higher than that of a metal material having low resistance such as aluminum or copper, since the voltage drop or the voltage rise due to the wiring resistance can be effectively suppressed by the voltage control circuit, the memory characteristics can be prevented from deteriorating due to the use of the high resistance wiring material.

BRIEF DESCRIPTION OF THE DRAWINGS

FIG. 9 is a table to compare voltage levels when the selected memory cell is on a drive point side, on a voltage control point side, and at the center of the selected word line in the cases where the first voltage control circuit is provided and where it is not provided.

EXPLANATION OF REFERENCES

Figure 1:
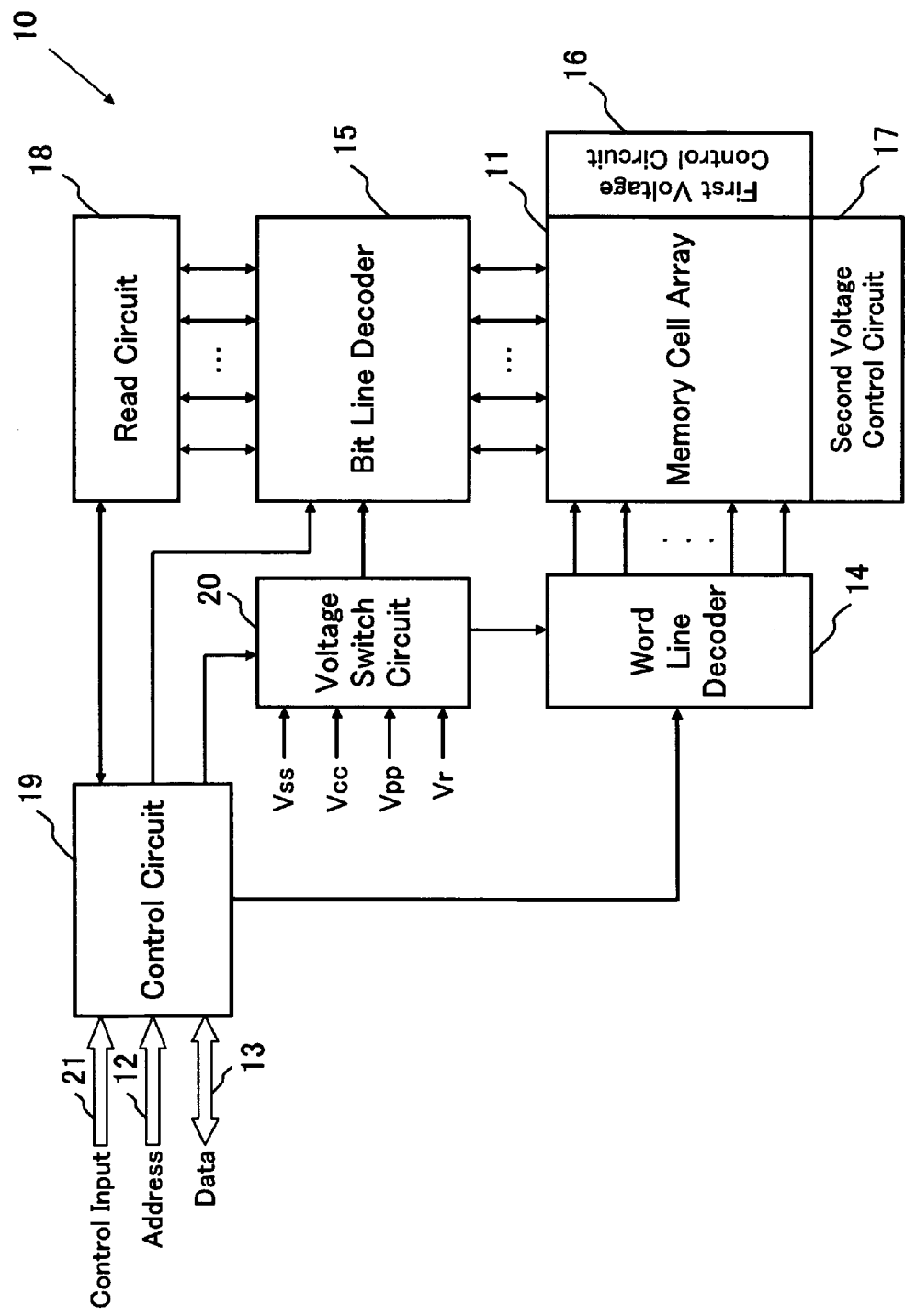
FIG. 1 is a block diagram showing a schematic circuit constitution example according to a non-limiting embodiment of a nonvolatile semiconductor memory device.

10: Nonvolatile semiconductor memory device according to a non-limiting embodiment of the present invention
11: Memory cell array
12: Address line
13: Data line
14: Word line decoder (word line selection circuit)
15: Bit line decoder (corresponding to bit line selection circuit)
16: First voltage control circuit (voltage control circuit)
17: Second voltage control circuit (voltage control circuit)
18: Read circuit
19: Control circuit
20: Voltage switch circuit
21: Control signal line
30, 31, 40, 41: Diode circuit
32: N-type MOS transistor
33, 43: Inverter
41: P-type MOS transistor
BL, BL0 to BL3: Bit line
C1, C2: Voltage control point
D1, D2: Drive point
Ib0, Ib1, Ib3: Memory cell current
Iw: Program current
Iw0, Iw1, Iw3: Memory cell current
M, M00 to M33: Memory cell
RW20 to RW24: Wiring resistance of word line
Vcc: Supply voltage (power supply voltage)
Vpp: Program voltage, erase voltage
Vpp/2: Program inhibit voltage, erase inhibit voltage
Vr: Read voltage
Vss: Ground voltage
W1, WL0 to WL3: Word line

DETAILED DESCRIPTION

A nonvolatile semiconductor memory device according to a non-limiting embodiment of the present invention (referred to as a device of the present invention for short occasionally hereinafter) will be described with reference to the drawings hereinafter.

FIG. 1 is a block diagram showing one embodiment of a nonvolatile semiconductor memory device 10 of the present invention. As shown in FIG. 1, the device 10 includes a memory cell array 11, a word line decoder (corresponding to a word line selection circuit) 14, a bit line decoder (corresponding to a bit line selection circuit) 15, a first voltage control circuit (corresponding to voltage control circuit) 16, a second voltage control circuit (corresponding to a voltage control circuit) 17, a read circuit 18, a control circuit 19, and a voltage switch circuit 20.

The memory cell array 11 includes a plurality of nonvolatile memory cells arranged in row and column directions, and information can be programmed electrically in the memory cell specified by an address input from the outside, and information stored in the memory cell specified by the address input can be read. Mote specifically, information is stored in the specific memory cell in the memory cell array 11 according to an address signal inputted from address line 12, and the information is outputted to an external device through data 13.

More specifically, the memory cell array 11 has a cross-point type memory cell array structure in which the two-terminal structured memory cells each having a variable resistance element that stores information in response to a change of electric resistance are arranged in the row and column directions, a plurality of word lines extend in the row direction, a plurality of bit lines extend in the column direction, one ends of the memory cells of the same row are connected to the common word line, and the other ends of the memory cells of the same column are connected to the common bit line. In addition, according to the memory cell in this embodiment, information can be programmed when the electric resistance of the variable resistance element is changed in response to an electric stress (program voltage) applied to both ends of the variable resistance element.

The word line decoder 14 selects the word line of the memory cell array 11 according to a row select address signal inputted to the address line 12 as a selected word line, and applies a selected word line voltage and an unselected word line voltage to the selected word line and unselected word lines, respectively, according to each memory operation of programming, erasing and reading.

The bit line decoder 15 selects the bit line of the memory cell array 11 according to a column select address signal inputted to the address line 12 as a selected bit line, and applies a selected bit line voltage and an unselected bit line voltage to the selected bit line and unselected bit lines, respectively, according to each memory operation of programming, erasing and reading.

The first voltage control circuit 16 is connected to each word line on the opposite side and at the farthest point from a drive point at which each word line is driven by the word line decoder 14, and prevents a voltage at the farthest point set as a voltage control point from fluctuating from the selected word line voltage (corresponding to a control reference voltage) applied to the drive point of the selected word line from the word line decoder 14. In addition, the second voltage control circuit 17 is connected to each bit line on the opposite side and at the farthest point from a drive point at which each bit line is driven by the bit line decoder 15, and prevents a voltage at the farthest point set as a voltage control point from fluctuating from the selected bit line voltage (corresponding to a control reference voltage) applied to the drive point of the selected bit line from the bit line decoder 15.

More specifically, the first voltage control circuit 16 and the second voltage control circuit 17 actively prevent the above voltage fluctuation at the time of programming and erasing operations, and the directions of the voltage fluctuation on the selected word line and the selected bit line are determined depending on a relative relation among the levels of the selected word line voltage, the unselected word line voltage, the selected bit line voltage, and the unselected bit line voltage. Therefore, since the specific circuit constitutions of the first voltage control circuit 16 and the second voltage control circuit 17 are varied according to the direction of the voltage fluctuation to be controlled, they will be described together with the description of a voltage application condition below.

The control circuit 19 controls each memory operation of programming, erasing and reading of the memory cell array 11. The control circuit 19 controls the word line decoder 14 and the bit line decoder 15 based on the address signal inputted from the address line 12, data input (at the time of programming operation) inputted from the data line 13, and a control input signal inputted from a control signal line 21, to control the reading, programming and erasing operations of the memory cell array 11. The control circuit 19 functions as a general address buffer circuit, data input/output buffer circuit, and a control input buffer circuit although they are not shown in the example in FIG. 1.

The voltage switch circuit 20 applies the selected word line voltage, the unselected word line voltage, the selected bit line voltage, and the unselected bit line voltage required at the time of the reading, programming and erasing operations of the memory cell array 11, to the word line decoder 14 and the bit line decoder 15. A reference character Vcc designates a supply voltage (power supply voltage), Vss designates the ground voltage, Vpp designates a program or erase voltage, and Vr designates a read voltage.

The data is read from the memory cell array 11 through the bit line decoder 15 and the read circuit 18. The read circuit 18 determines the state of the data and sends its result to the control circuit 19 to be outputted to the data line 13.

Figure 2:
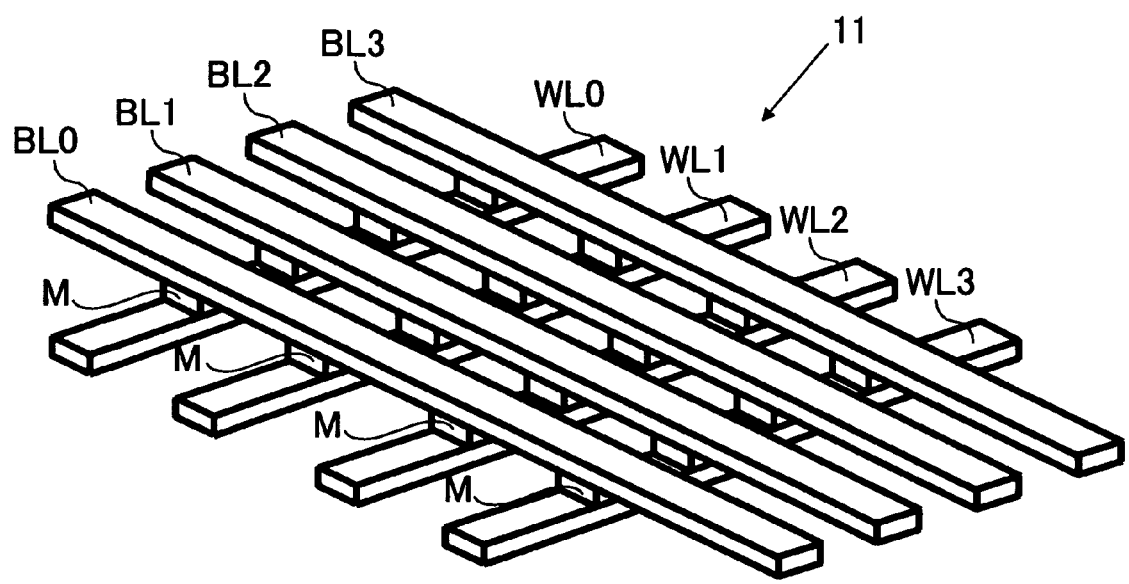
FIG. 2 is a perspective view schematically showing a partial constitution of a cross-point type memory cell array.
Figure 3:
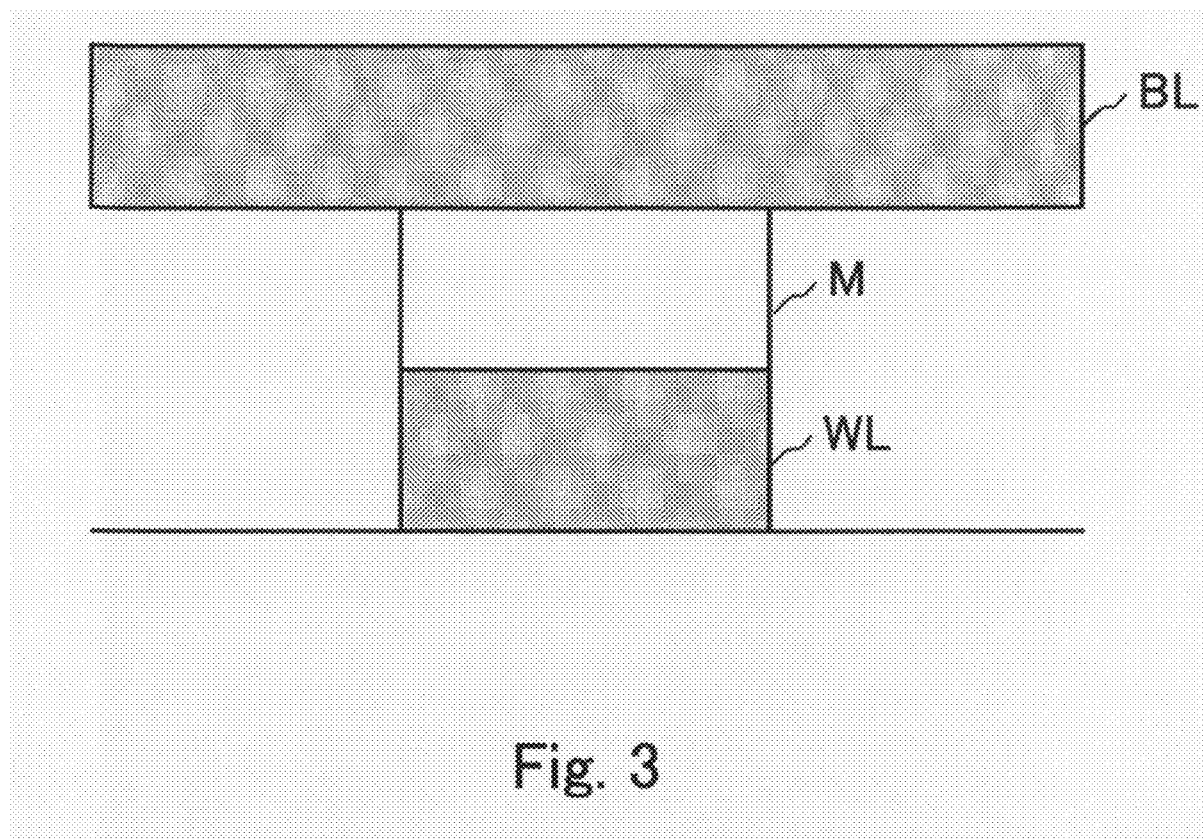
FIG. 3 is a vertical sectional view showing a memory cell in the cross-point type memory cell array shown in FIG. 2.

FIG. 2 is a schematic view partially showing the constitution of the cross-point type memory cell array 11. According to the memory cell array 11 shown in FIG. 2, memory cells M are disposed at the intersection points of four bit lines BL0 to 3 and four word lines WL0 to 3. FIG. 3 is a vertical sectional view of the memory cell taken along the extending direction of the bit line BL. The memory cell M includes a memory cell in which a diode and an anti-fuse are connected in series disclosed in the non-patent document 1, a memory cell formed of a transition metal oxide such as PrCaMnO or NiO whose resistance is changed by an electric stress disclosed in the non-patent document 2 and the non-patent document 3 or a phase change material such as GeSeTe whose phase is changed by a thermal stress due to a current disclosed in the non-patent document 4, and a memory cell made of a series circuit of a diode and one of the above materials.

In addition, the word line WL0 to 3 and the bit line BL0 to 3 are preferably formed of tungsten having a melting point higher than that of aluminum and copper, high melting point metal such as platinum or polysilicon in view of the case where the memory cell array 11 is multilayered. A description will be made assuming that the bit lines BL0 to 3 and the word lines WL0 to 3 are formed of platinum and the memory cell M is formed of PrCaMnO and used as a single variable resistor.

A description will be made of a voltage application condition at the time of each memory operation of the cross-point type memory cell array according to this embodiment, taking a 4×4 memory cell as an example. The selected memory cell to be used for the memory operation is assumed as a memory cell M22 in the following description.

Figure 4:
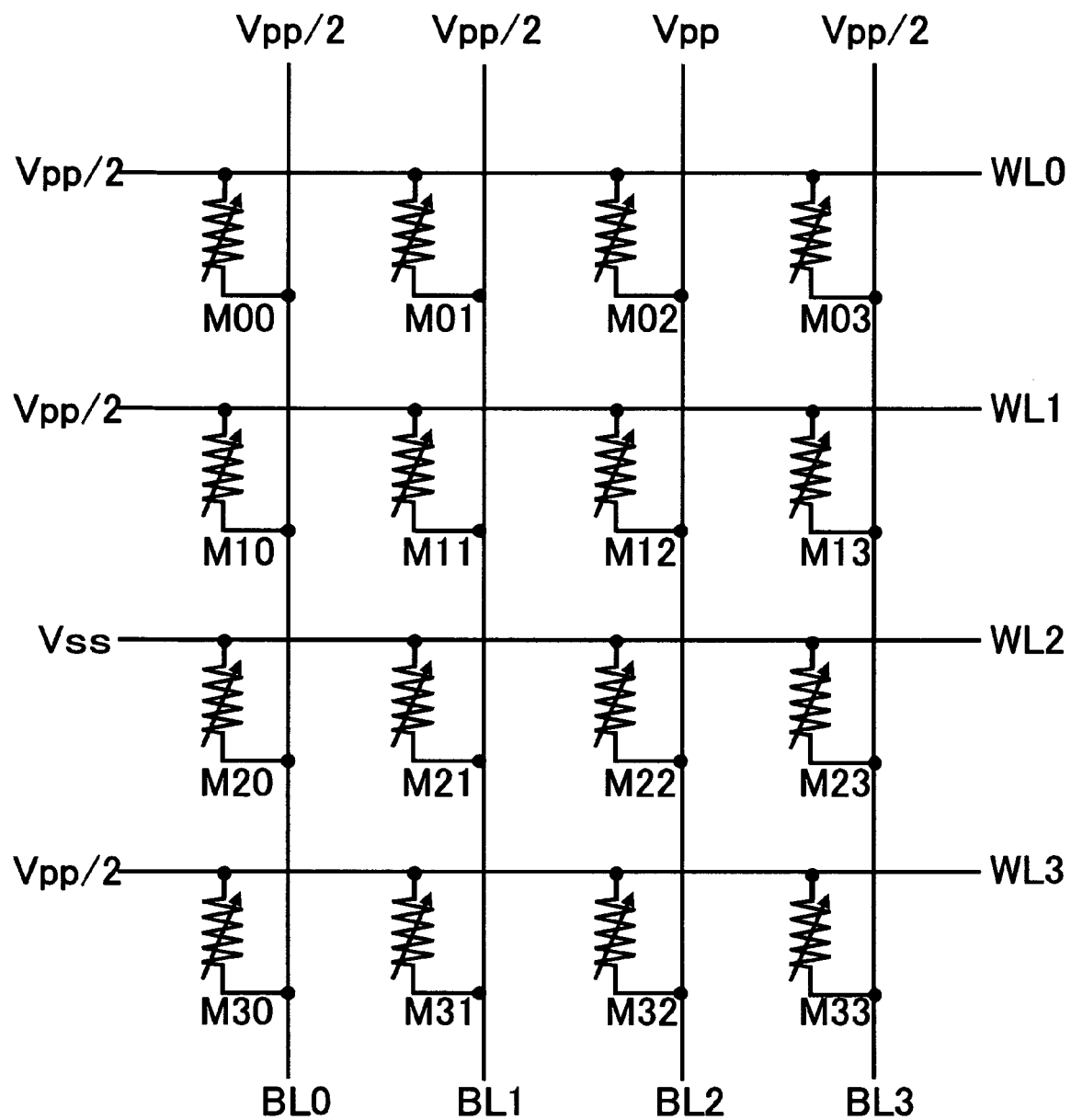
FIG. 4 is an equivalent circuit diagram showing one example of a voltage application condition at the time of programming operation in a 4×4 cross-point type memory cell array.

As shown in FIG. 4, according to the voltage application condition at the time of programming operation, a program voltage Vpp is applied to the selected bit line BL2, a program inhibit voltage Vpp/2 that is the half of the program voltage Vpp is applied to the unselected bit lines BL0, BL1 and BL3, the ground voltage Vss is applied to the selected word line WL2, and the program inhibit voltage Vpp/2 is applied to the unselected word lines WL0, WL1 and WL3. As a result, the program voltage Vpp is applied across the selected memory cell M22, and the program inhibit voltage Vpp/2 is applied across the unselected memory cells connected to the selected bit line BL2 or the selected word line WL2 (referred to as "half-unselected memory cells" occasionally hereinafter), and zero voltage is applied across other unselected memory cells (referred to as "completely unselected memory cells" occasionally hereinafter). Here, a lower limit value of the program voltage (absolute value) required for the programming operation of the memory cell is set to be higher than the program inhibit voltage Vpp/2 (absolute value) to prevent the half-unselected memory cell from being programmed.

Figure 5:
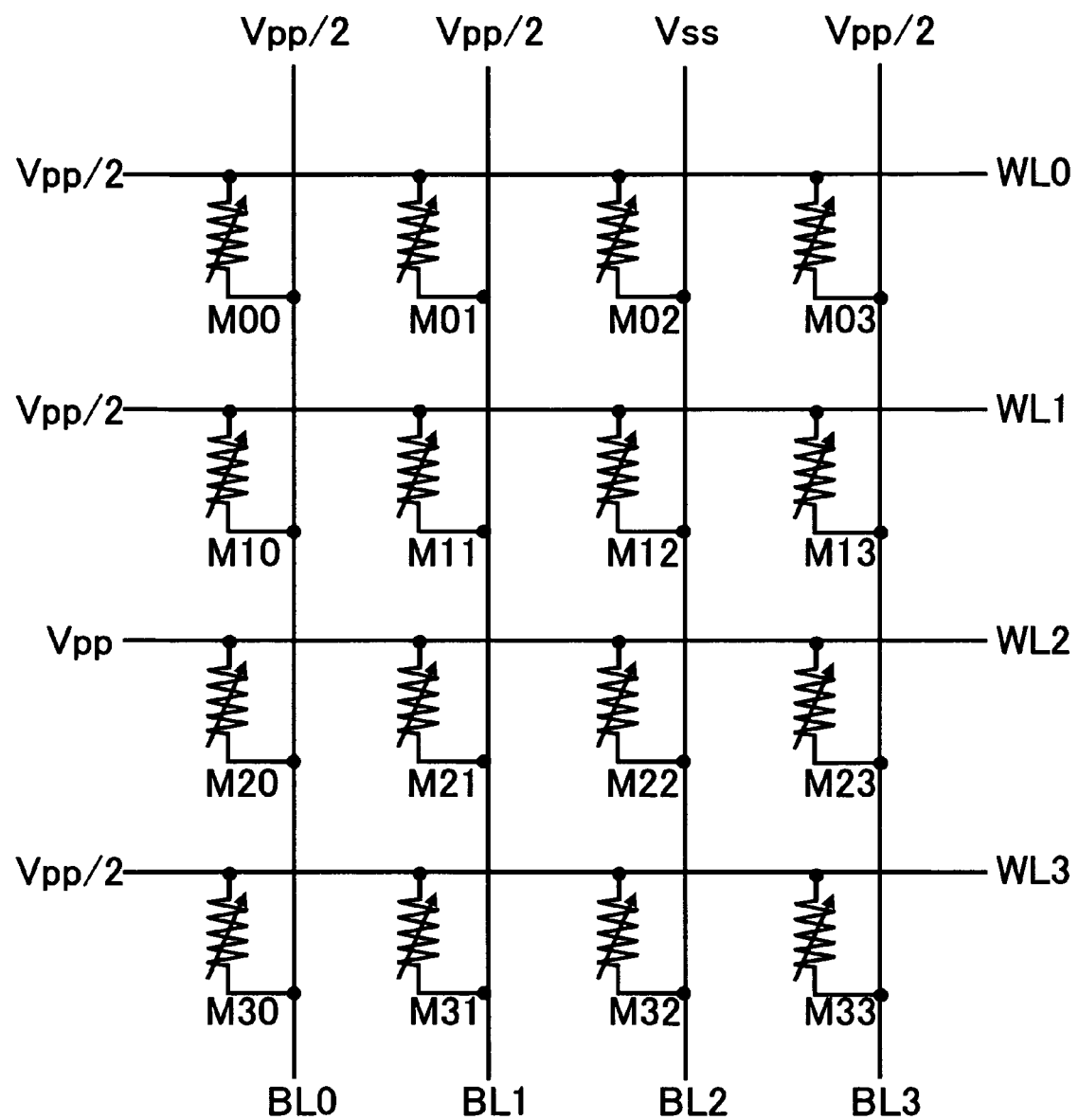
FIG. 5 is an equivalent circuit diagram showing one example of a voltage application condition at the time of erasing operation in the 4×4 cross-point type memory cell array.

As shown in FIG. 5, according to the voltage application condition at the time of erasing operation, the ground voltage Vss is applied to the selected bit line BL2, an erase inhibit voltage Vpp/2 that is the half of the erase voltage Vpp is applied to the unselected bit lines BL0, BL1 and BL3, the erase voltage Vpp is applied to the selected word line WL2, and the erase inhibit voltage Vpp/2 is applied to the unselected word lines WL0, WL1 and WL3. As a result) the erase voltage Vpp is applied across the selected memory cell M22, and the erase inhibit voltage Vpp/2 is applied to across the half-unselected memory cells with its polarity opposite to that of the programming operation, and a zero voltage is applied across the other completely unselected memory cells. Here, a lower limit value of the erase voltage (absolute value) required for the erasing operation of the memory cell is set to be higher than the erase inhibit voltage Vpp/2 (absolute value) to prevent the half-unselected memory cell from being erased.

Figure 6:
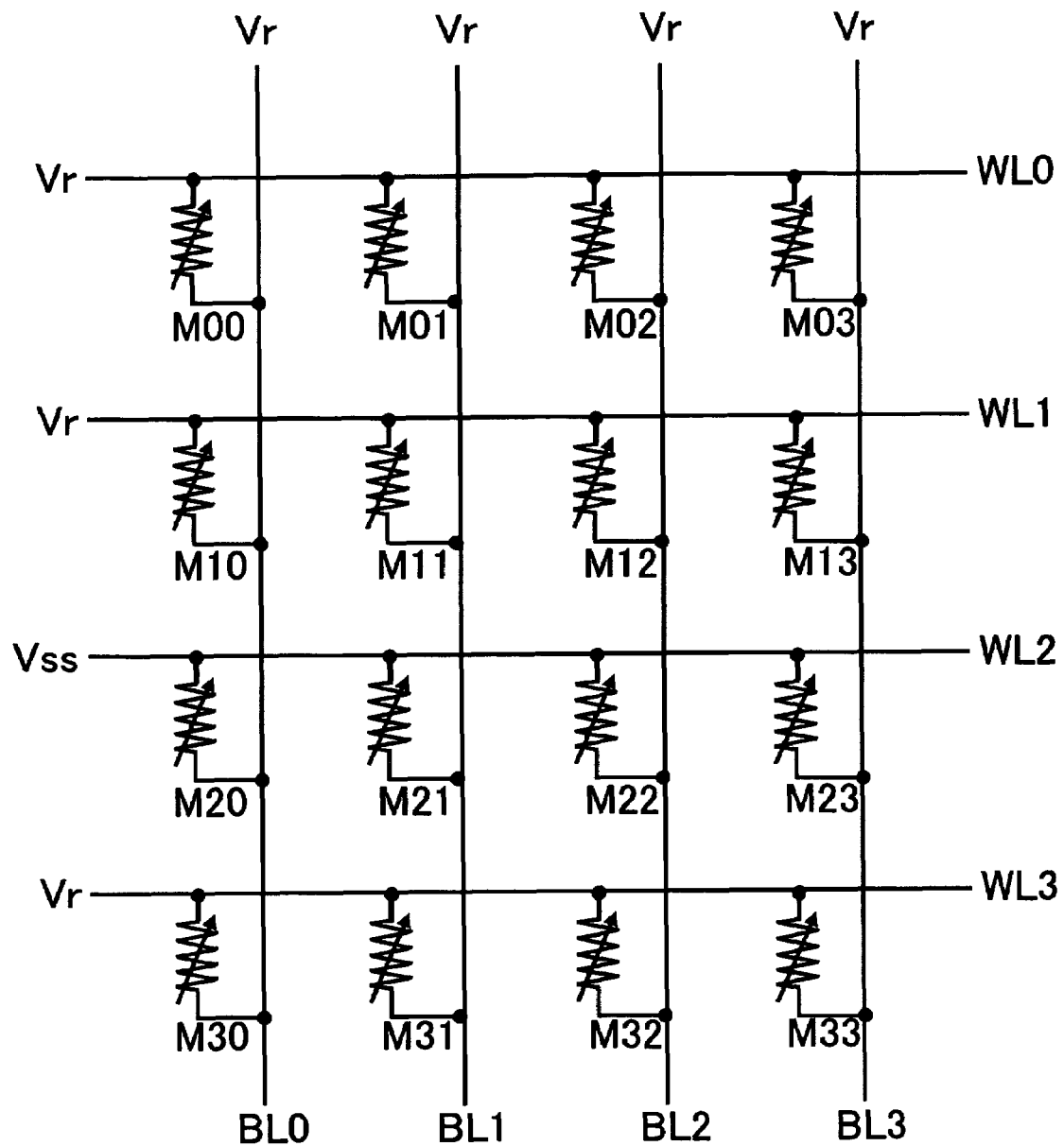
FIG. 6 is an equivalent circuit diagram showing one example of a voltage application condition at the time of reading operation in the 4×4 cross-point type memory cell array.

As shown in FIG. 6, according to the voltage application condition at the time of reading operation, a read voltage Vr is applied to all the bit lines BL0 to 3, the ground voltage Vss is applied to the selected word line WL2, and the read voltage Vr is applied to the unselected word lines WL0, WL1 and WL3. Since a read current flows in each memory cell of the selected word line WL2, when the read current of the selected bit line BL2 of the bit lines BL0 to 3 is selectively detected, the data of the selected memory cell M22 is read. In addition, to prevent unnecessary programming operation and erasing operation at the read voltage while the read voltage Vr is applied to each memory cell of the selected word line WL2, the read voltage Vr (absolute value) is set to be the program inhibit voltage Vpp/2 or less.

Figure 7:
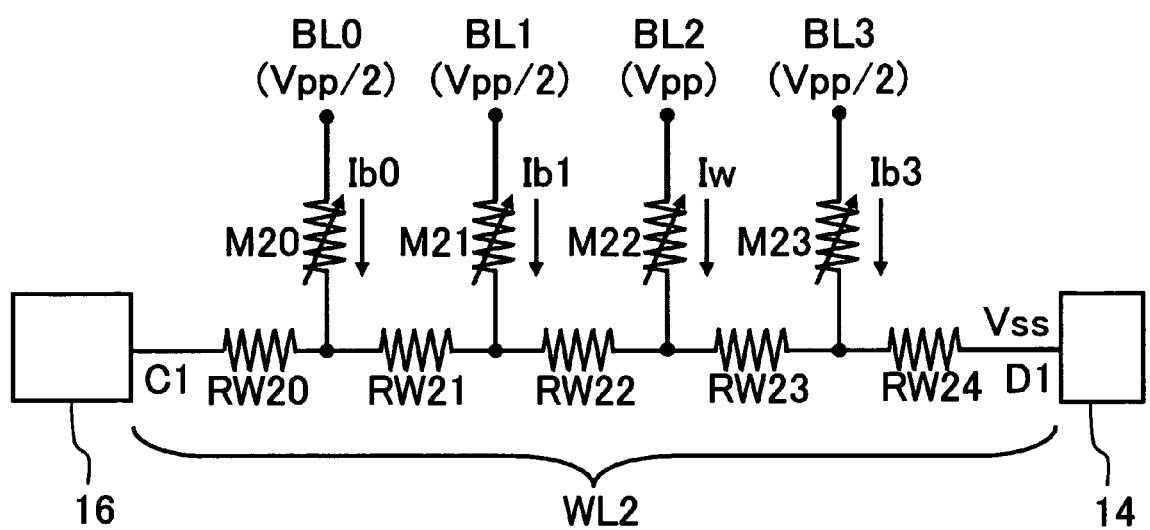
FIG. 7 is an equivalent circuit diagram showing a connection relation between a selected word line WL2 and bit lines BL0 to 3 in the 4×4 cross-point type memory cell array shown in FIG. 4.

FIG. 7 schematically shows the connection relation between the selected word line WL2 and the bit lines BL0 to 3 with an equivalent circuit diagram showing the selected word line WL2 as a distributed constant circuit of wiring resistances RW20 to RW24. One end (right side in the drawing) of the selected word line WL2 is connected to the word line decoder 14 at a drive point D1, and the other end (left side in the drawing) thereof is connected to the first voltage control circuit 16 at a voltage control point C1. The bit lines BL0 to 3 are connected to the selected word line WL2 through the memory cells M20 to M23, respectively.

According to the voltage application condition at the time of programming operation shown in FIG. 4, the program voltage Vpp is applied to the selected memory cell M22, and the program inhibit voltage Vpp/2 is applied to the half-unselected memory cells M20, M21 and M23, so that a program current Iw flows in the selected memory cell M22 and memory cell currents Ib0, Ib1 and Ib3 corresponding to the resistance values flow in the half-unselected memory cells M20, M21 and M23, respectively through the selected word line WL2 toward the drive point D1.

At this time, when the first voltage control circuit 16 is in an inactive state, the word line voltages applied to the ends of the memory cells M20 to M23 on the side of the selected word line WL2 are raised in the direction away from the drive point D1 due to the current flowing in the wiring resistance of the word line between each end and become different voltages. Therefore, the program voltages applied across the selected memory cell are different among the memory cells M20 to M23. When the wiring resistance of the word line is considerably smaller than the resistance of the memory cell, there is no problem, but when the resistance value of the memory cell is at the same level as the wiring resistance or at non-negligible level, the difference affects the program voltage considerably, and the resistance value after programming is varied. This phenomenon becomes a serious problem when the wiring resistance of the word line is high or the program current is large.

Thus, at the time of programming operation, the above problem can be solved or alleviated by constituting the first voltage control circuit 16 connected to the selected word line WL2 such that it is activated automatically in response to the rise of the voltage level at the voltage control point C1 and lowers the voltage level at the voltage control point C1 to the same voltage level as the voltage level (Vss) at the drive point D1.

Figure 8A:
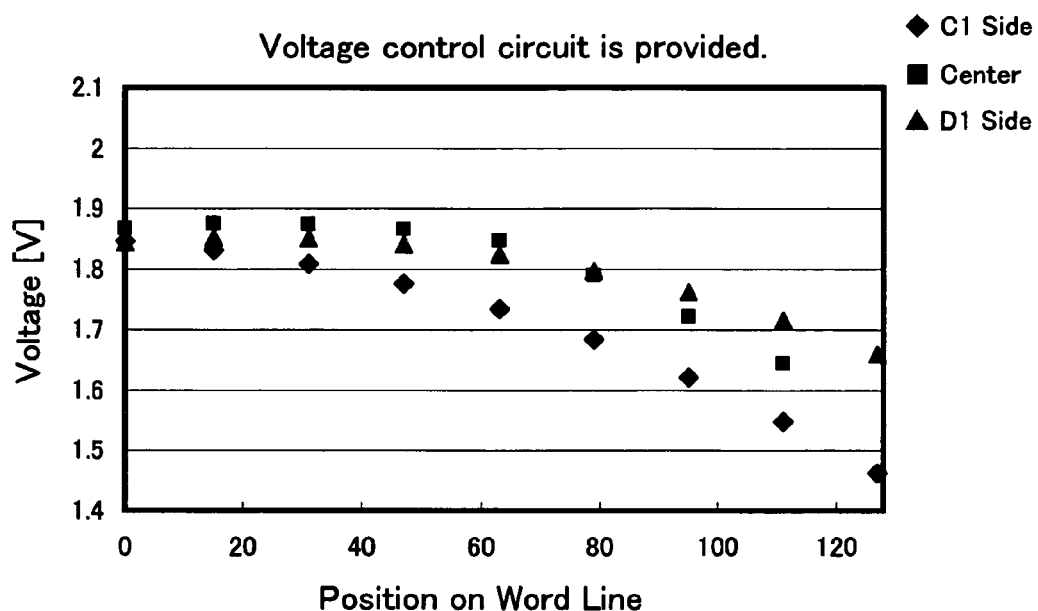
FIG. 8 is a characteristic graph showing position dependency on the word line of the voltage level of the selected word line in the cases where a first voltage control circuit is provided (A) and where it is not provided (B).
Figure 8B:
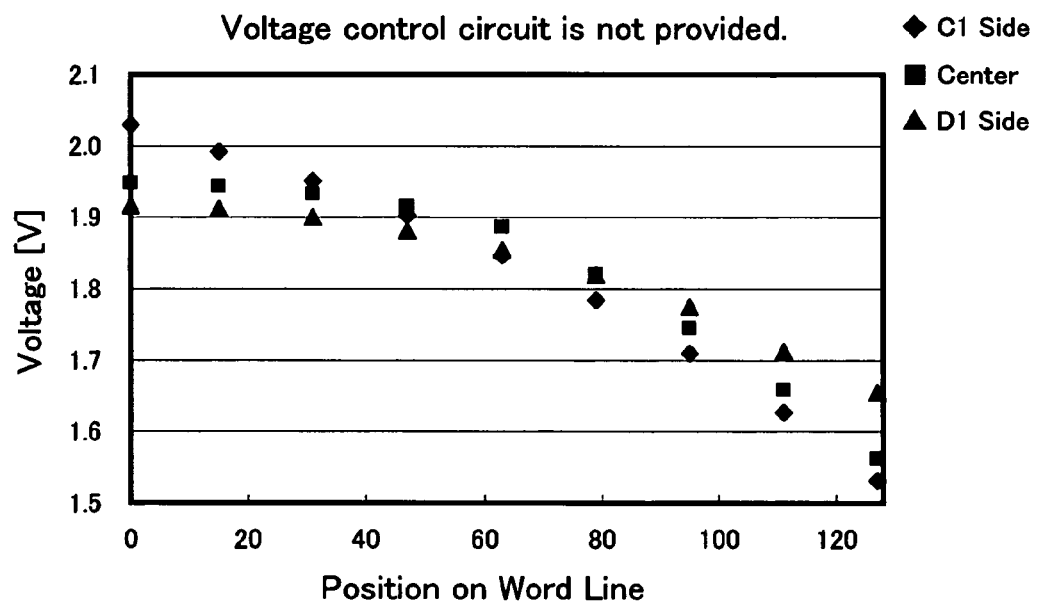

FIGS. 8A and 8B show circuit simulation results of the voltage level of the selected word line when 128 memory cells are connected to the selected word line, that is, when there are 128 bit lines, in both cases where the first voltage control circuit 16 is provided (A) and where it is not provided (B). The voltages of the selected memory cells at three positions including a position on the side of the drive point D1, a position on the side of the voltage control point C1 and a position at the center of the selected word line are compared in both cases where the first voltage control circuit 16 is provided (A) and where it is not provided (B). As a simulation model, it is assumed that the wiring resistance of the word line is 1Ω, the resistance value of the selected memory cell is 1 kΩ, the resistance value of the half-unselected memory cell is 20 kΩ, and the program voltage Vpp is 5 V, the current drive ability of the word line decoder 14 toward the ground voltage Vss is set to be equal to that of the first voltage control circuit 16.

The numerals of each horizontal axis in FIG. 8 designate the number of the memory cells counted from the side of the voltage control point C1 and it approaches the drive point D1 in the right direction. Each vertical axis in FIG. 8 shows a voltage level of the selected word line at the connection point with the memory cell, it is shown that the voltage of the memory cell (right side) becomes higher with distance from the drive point D1. FIG. 9 is a table showing voltage levels of the selected memory cells positioned on the side of the drive point D1, on the side of the voltage control point C1 and at the center of the selected word line in both cases where the first voltage control circuit 16 is provided (A) and where it is not provided (B). It can be understood from FIGS. 8 and 9 that while the voltage level difference between the selected memory cells positioned at the drive point D1 and the voltage control point C1 is 0.37 V in the case where the first voltage control circuit 16 is not provided (B), the voltage difference is 0.19 V in the case where the first voltage control circuit 16 is provided (A), which is considerably smaller than the above case.

Figure 10A:
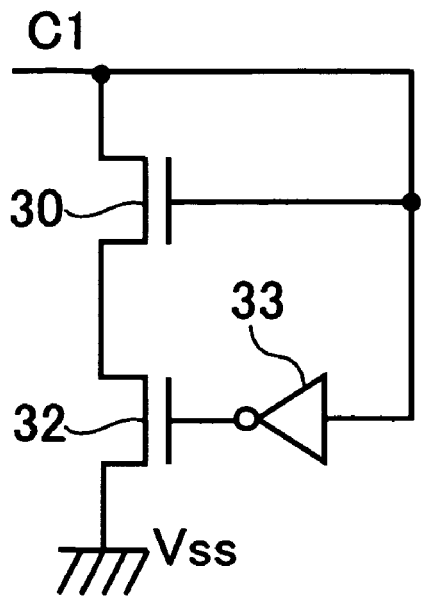
FIG. 10 is a circuit diagram showing the circuit constitution example of the first voltage control circuit to suppress the voltage rise of the selected word line according to a non-limiting embodiment of the nonvolatile semiconductor memory device.
Figure 10B:
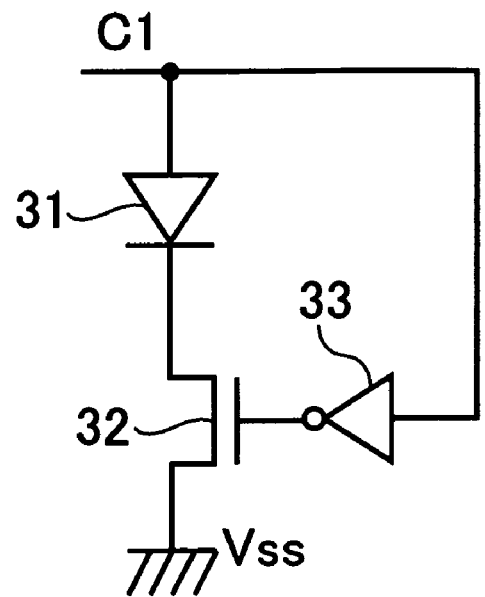
Figure 10C:
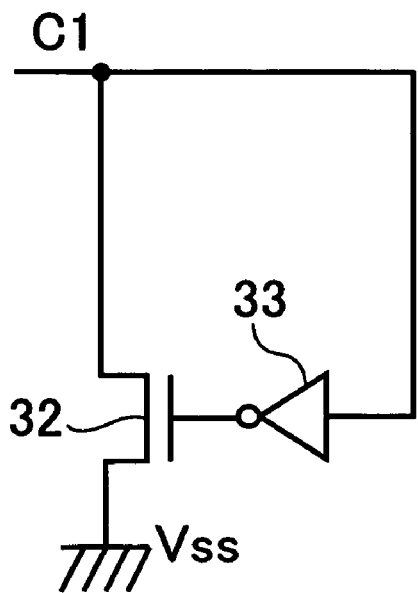

A circuit configuration of the first voltage control circuit 16 for preventing the voltage of the selected word line from rising includes circuit configurations shown in FIGS. 10A to 10C.

According to the non-limiting circuit examples shown in FIGS. 10A and 10B, the first voltage control circuit 16 is constituted such that a diode circuit 30 or 31 and an N-type MOS transistor 32 are connected in series between the voltage control point C1 and the ground voltage Vss, and the input of an inverter 33 and the output of the inverter 33 are connected to the voltage control point C1 and the gate of the MOS transistor 32, respectively. The diode circuit 30 includes an N-type MOS transistor in which the drain and the gate are connected to each other in FIG. 10A, and the diode circuit 31 includes a PN junction type diode element in FIG. 10B. In addition, according to the circuit example shown in FIG. 10C, the first voltage control circuit 16 is constituted such that the drain and the source of the N type MOS transistor 32 are connected to the voltage control point C1 and the ground voltage Vss, respectively, and the input of the inverter 33 and the output of the inverter 33 are connected to the voltage control point C1 and the gate of the MOS transistor 32, respectively.

The lower limit value of a voltage rise detection level at the voltage control point C1 can be set higher than the ground voltage Vss by adjusting the turn-on voltage of the diode circuits 30 or 31 between the ground voltage Vss and the voltage control point C1 (turn-on threshold voltage) in the circuit examples shown in FIGS. 10A and 10B. The lower limit is the ground voltage Vss in the circuit example shown in FIG. 10C. In addition, the upper limit value of the voltage rise detection level at the voltage control point C1 can be adjusted by adjusting the input inversion level of the inverter 33 and set to be lower than the program inhibit voltage Vpp/2 to be applied to the unselected word line. If the upper limit value of the voltage rise detection level is not set or it is not less than the program inhibit voltage Vpp/2, the first voltage control circuit 16 connected to the unselected word line is automatically activated in response to the unselected word line voltage Vpp/2 to lower the voltage level of the unselected word line voltage Vpp/2 unnecessarily, so that the program inhibit voltage Vpp/2 or more is applied to both ends of the half-unselected memory cell connected to the selected bit line and that memory cell could be programmed erroneously. Thus, according to this embodiment, the upper limit value of the voltage rise detection level at the voltage control point C1 is set to be lower than the program inhibit voltage Vpp/2 by adjusting the input inversion level of the inverter 33.

Figure 11:
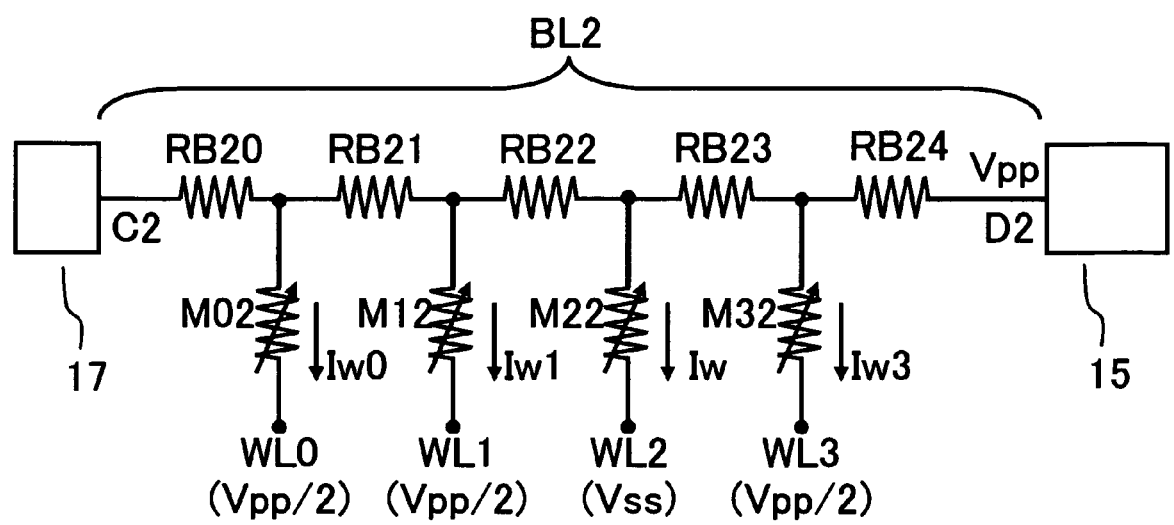
FIG. 11 is an equivalent circuit diagram showing a connection relation between a selected bit line BL2 and word lines WL0 to 3 in the 4×4 cross-point type memory cell array shown in FIG. 4.

FIG. 11 schematically shows the connection relation between the selected bit line BL2 and the word lines WL0 to 3 with an equivalent circuit diagram showing the selected bit line BL2 as a distributed constant circuit of wiring resistances RB20 to RB24. One end (right side in the drawing) of the selected bit line BL2 is connected to the bit line decoder 15 at a drive point D2, and the other end (left side in the drawing) thereof is connected to the second voltage control circuit 17 at a voltage control point C2. The word lines WL0 to 3 are connected to the selected bit line BL2 through the memory cells M02 to M32, respectively.

According to the voltage application condition at the time of programming operation shown in FIG. 4, the program voltage Vpp is applied to across the selected memory cell M22, and the program inhibit voltage Vpp/2 is applied across the half-unselected memory cells M02, M12 and M32, so that a program current Iw flows in the selected memory cell M22 and memory cell currents Iw0, Iw1 and Iw3 corresponding to the resistance values flow in the half-unselected memory cells M02, M12 and M32, respectively from the drive point D2 through the selected bit line BL2.

At this time, when the second voltage control circuit 17 is in an inactive state, the bit line voltages applied to the ends of the memory cells M02 to M32 on the side of the selected bit line 13L2 are lowered in the direction away from the drive point D2 due to the current flowing in the wiring resistance of the bit line between each end and become different voltages. Therefore, the program voltages applied across the selected memory cell are different among the memory cells M02 to M32. When the wiring resistance of the bit line is considerably smaller than the resistance of the memory cell, there is no problem, but when the resistance value of the memory cell is at the same level as the wiring resistance or at non-negligible level, the difference affects the program voltage considerably, and the resistance value after programming is varied. This phenomenon becomes a serious problem when the wiring resistance of the bit line is high or the program current is large.

Thus, at the time of programming operation, the above problem can be solved or alleviated by constituting the second voltage control circuit 17 connected to the selected bit line BL2 such that it is activated automatically in response to the drop of the voltage level at the voltage control point C2 and raises the voltage level at the voltage control point C2 to the same voltage level as the voltage level (Vpp) at the drive point D2.

Figure 12A:
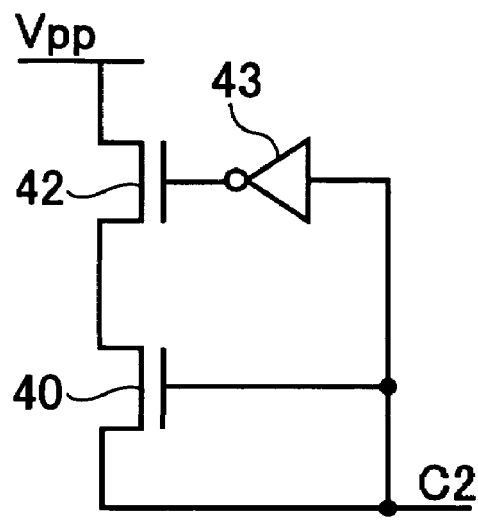
FIG. 12 is a circuit diagram showing a non-limiting circuit constitution example of a second voltage control circuit to prevent the voltage drop of the selected bit line.
Figure 12B:
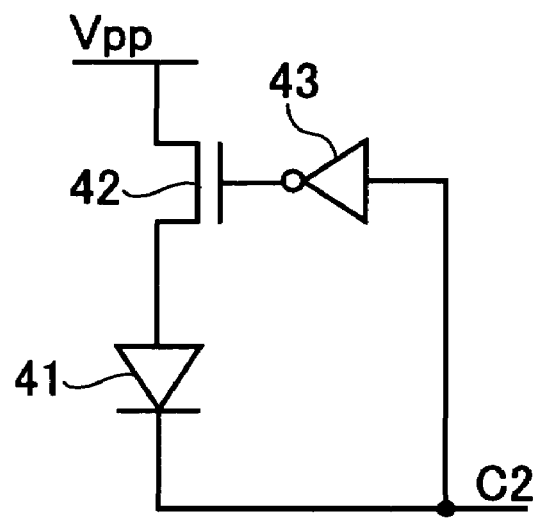
Figure 12C:
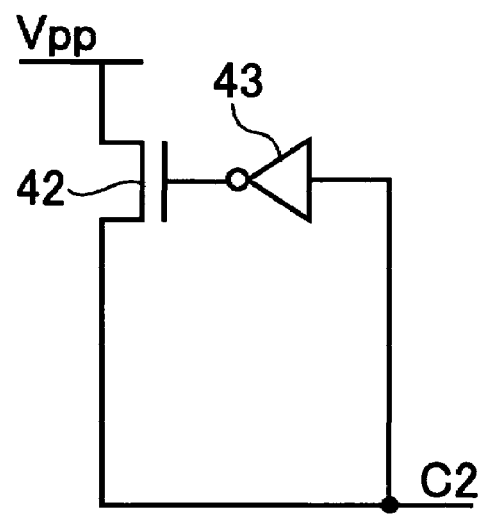

A circuit configuration of the second voltage control circuit 17 for preventing the voltage of the selected bit line from dropping includes circuit configurations shown in FIGS. 12A to 12C.

According to the circuit examples shown in FIGS. 12A and 12B, the second voltage control circuit 17 is constituted such that a diode circuit 40 or 41 and a P-type MOS transistor 42 are connected in series between the voltage control point C2 and the program voltage Vpp, and the input of an inverter 43 and the output of the inverter 43 are connected to the voltage control point C2 and the gate of the MOS transistor 42, respectively. The diode circuit 40 includes a P-type MOS transistor in which the drain and the gate are connected to each other in FIG. 12A, and the diode circuit 41 includes a PN junction type diode element in FIG. 12B. In addition, according to the circuit example shown in FIG. 12C, the second voltage control circuit 17 is constituted such that the drain and the source of the P-type MOS transistor 42 are connected to the voltage control point C2 and the program voltage Vpp, respectively, and the input of the inverter 43 and the output of the inverter 43 are connected to the voltage control point C2 and the gate of the MOS transistor 42, respectively.

The upper limit value of a voltage drop detection level at the voltage control point C2 can be set lower than the program voltage Vpp by adjusting the turn-on voltage of the diode circuit 40 or 41 between the program voltage Vpp and the voltage control point C2 (turn-on threshold voltage) in the circuit examples shown in FIGS. 12A and 12B. The upper limit is the program voltage Vpp in the circuit example shown in FIG. 12C. In addition, the lower limit value of the voltage drop detection level at the voltage control point C2 can be adjusted by adjusting the input inversion level of the inverter 43 and set to be higher than the program inhibit voltage Vpp/2 to be applied to the unselected bit line. If the lower limit value of the voltage drop detection level is not set or it is not more than the program inhibit voltage Vpp/2, the second voltage control circuit 17 connected to the unselected bit line is automatically activated in response to the unselected bit line voltage Vpp/2 to raise the voltage level of the unselected bit line voltage Vpp/2 unnecessarily, so that the program inhibit voltage Vpp/2 or more is applied to both ends of the half-unselected memory cell connected to the selected word line and that memory cell could be programmed erroneously. Thus, according to this embodiment, the lower limit value of the voltage drop detection level at the voltage control point C2 is set to be higher than the program inhibit voltage Vpp/2 by adjusting the input inversion level of the inverter 43.

According to this embodiment, as shown in FIG. 6, since the read current is detected from the drive point side (bit line decoder 15 side) at the time of reading operation, when the second voltage control circuit 17 is automatically activated in response to the drop of the bit line voltage at the voltage control point C2 at the time of the reading operation, since a part of the read current is supplied from the side of the second voltage control circuit 17, the read current cannot be detected correctly on the side of the bit line decoder 15. Thus, the input inversion level of the inverter 43 is adjusted so that the second voltage control circuit 17 may not react to the bit line voltage Vr at the time of reading operation. According to this embodiment, since the read voltage Vr is not more than the program inhibit voltage Vpp/2, the second voltage control circuit 17 does not malfunction at the time of reading operation.

In addition, when the operation condition of the second voltage control circuit 17 is different at the time of programming operation and reading operation, the input inversion levels of the inverter 43 are not the same in both operations in some cases. In this case, the second voltage control circuit 17 can be made not to react to the drop of the bit line voltage at the time of reading operation by adjusting the turn-on threshold voltage of the diode circuits 40 and 41 in the circuit examples in FIGS. 12A and 12B, respectively.

Although the circuit operations and circuit configurations of the first voltage control circuit 16 and the second voltage control circuit 17 at the time of programming operation have been described in detail in the above since the relation between the word line and the bit line are reversed at the time of erasing operation in this embodiment, the circuit configurations employed as the first voltage control circuit 16 and the second voltage control circuit 17 can be also used in the erasing operation.

Next, another embodiment will be described.

(1) Although the description has been made assuming that the single variable resistor formed of PrCaMnO is used as the memory cell and the directions of the program current and the erase current are reversed, as one example, in the case of the memory cell in which programming is performed only one time using an anti-fuse with a diode, and there is no erasing operation, or the polarities of the program voltage and the erase voltage are the same, it is only necessary to consider the circuit constitutions of the first voltage control circuit 16 and the second voltage control circuit 17 at the time of programming operation.

In addition, even in the case where the memory cell can be used at both programming and erasing operations, when there is a difference in voltage fluctuation generated in the programming operation and the erasing operation, the circuit configurations of the first voltage control circuit 16 and the second voltage control circuit 17 may be specified so as to control only the one having the larger voltage fluctuation.

Furthermore, when there is a difference in voltage fluctuation generated in the selected word line and the selected bit line, either the first voltage control circuit 16 or the second voltage control circuit 17 may be provided so as to control only the one having the larger voltage fluctuation.

(2) Although the first voltage control circuit 16 is connected to the word lines on the opposite side and at the farthest point from the drive point at which each word line is driven by the word line decoder 14, and the farthest point is set to the voltage control point, and the second voltage control circuit 17 is connected to the bit lines on the opposite side and at the farthest point from the drive point at which each bit line is driven by the bit line decoder 15, and the farthest point is set to the voltage control point in the above embodiment, the connection points between the first voltage control circuit 16 and the word lines, and between the second voltage control circuit 17 and bit lines are not limited to the ones in the above embodiment.

Figure 13:
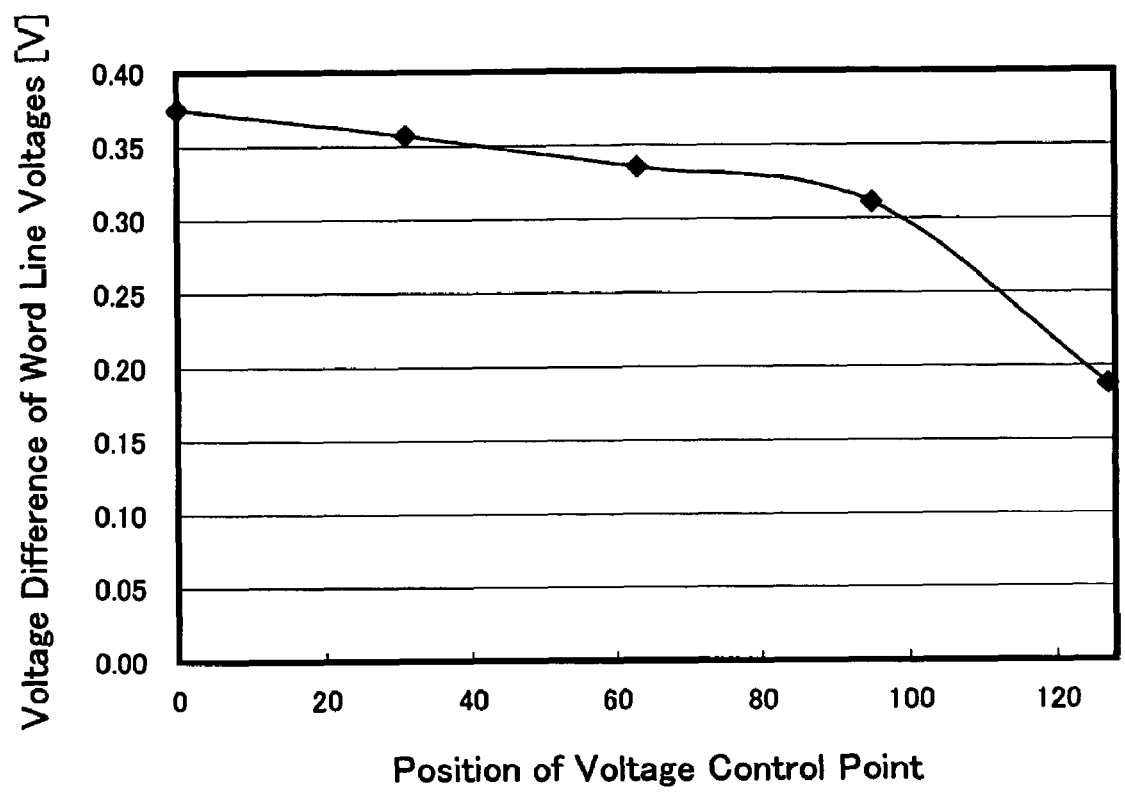
FIG. 13 is a characteristic graph showing a relation between the position of the first control circuit (voltage control point) and a voltage difference of the word line at the selected memory cell.

FIG. 13 shows a relation between a position (voltage control point) of the first voltage control circuit 16, and a voltage difference between the maximum value and minimum value of the voltage fluctuation in the word line at the selected memory cell. The voltage difference is calculated based on the maximum value and the minimum value of the word line voltage at the selected memory cell position while the position of the voltage control point is fixed and the position of the selected memory cell is changed. In addition, the circuit simulation result shown in FIG. 13 uses the same condition as the circuit simulation shown in FIG. 8. That is, it is assumed that the 128 memory cells are connected to the selected word line and it is assumed that the wiring resistance of the word line is 1Ω, the resistance value of the selected memory cell is 1 kΩ, the resistance value of the half-unselected memory cell is 20 kΩ, and the program voltage Vpp is 5 V, and the current drive ability of the word line decoder 14 toward the ground voltage Vss is set to be equal to that of the first voltage control circuit 16.

As shown in FIG. 13, when the connection points between the first voltage control circuit 16 and the word lines, and the second voltage control circuit 17 and the bit lines are provided at the farthest points from the word line decoder 14 and the bit line decoder 15, respectively, the voltage change width of the word line voltage change is minimum and the most effective result is provided, but even when they are provided closer to the word line decoder 14 and the bit line decoder 15 from the farthest points, respectively, the similar voltage fluctuation reducing effect as the above embodiment can be expected.

In addition, when the word line decoders 14 and the bit line decoders 15 are provided both ends of the word lines and the bit lines, respectively, it is preferable to provide the first voltage control circuit 16 and the second voltage control circuit 17 at middle points of the word lines and the bit lines, respectively.

(3) Although the circuits are illustrated as shown in FIGS. 10A to 10C and FIGS. 12A to 12C, as the circuit configurations of the first voltage control circuit 16 and the second voltage control circuit 17 in the above embodiment, the present invention is not limited to that circuit configurations.

For example, in the circuit operation of the first voltage control circuit 16 shown in FIGS. 10A to 10G, since the node to which the ground voltage Vss is applied only have to be supplied with the ground voltage Vss just for a period to prevent the voltage fluctuation, for a period while there is no need to prevent the voltage fluctuation, that is, a period for switching the selection of the word line, for example, the node may be supplied with the program inhibit voltage Vpp/2 to deactivate the first voltage control circuit 16.

Similarly, in the circuit operation of the second voltage control circuit 17 shown in FIGS. 12A to 12C, since the node to which the program voltage Vpp is applied only have to be supplied with the program voltage Vpp just for a period to prevent the voltage fluctuation, for a period while there is no need to prevent the voltage fluctuation, that is, a period for switching the selection of the word line, for example, the node may be supplied with the program inhibit voltage Vpp/2 to deactivate the second voltage control circuit 17. In addition, the read voltage Vr may be applied to the node and the power supply voltage of the inverter 43, at the time of reading operation to inactivate the second voltage control circuit 17.

Furthermore, although the above embodiment exemplifies the circuit configuration in which the first voltage control circuit 16 and the second voltage control circuit 17 are automatically activated and deactivated in response to the fluctuation of the word line voltage and the bit line voltage, respectively, the circuits may be activated and deactivated by an external control. For example, in the case of a hierarchical array structure in which a memory cell array is divided into a plurality of blocks in a row direction and a column direction, local word and bit lines are provided in each block, global word and bit lines are provided in the memory cell array, and selected and unselected word line voltages and selected and unselected bit line voltages are supplied to the local word and bit lines through block selection transistors for selecting the block, respectively, the global word and bit lines may be connected to the inputs of the inverters 33 and 44 in the circuit configurations shown in FIGS. 10A to 10C and FIGS. 12A to 12C.

(4) The voltage application condition of each memory operation shown in the above embodiment is only one example and does not limit the contents of the present invention and can be varied, as needed.

INDUSTRIAL APPLICABILITY

The Various as cots of the present invention can be applied to a nonvolatile semiconductor memory device and especially advantageously applied to a nonvolatile semiconductor memory device having a cross-point type memory cell array in which a plurality of two-terminal structured memory cells are disposed in a row direction and a column direction, a plurality of word lines extend in the row direction, a plurality of bit lines extend in the column direction, one ends of the memory cells connected to the same row are connected to the common word line, and the other ends thereof connected to the same column are connected to the common bit line.

The invention claimed is:

1. A nonvolatile semiconductor memory device, comprising:
a memory cell array comprising a plurality of two-terminal structured memory cells disposed in a row direction and a column direction, a plurality of word lines extending in the row direction, and a plurality of bit lines extending in the column direction, in which one ends of the memory cells in a same row are connected to a common word line, and other ends of the memory cells in a same column are connected to a common bit line;
a word line selection circuit arranged to select one or more word lines from the plurality of word lines as selected word lines, and apply selected word line voltage and an unselected word line voltage to the selected word lines and unselected word lines, respectively;
a bit line selection circuit arranged to select one or more bit lines from the plurality of bit lines as selected bit lines, and apply a selected bit line voltage and an unselected bit line voltage to the selected bit lines and unselected bit lines, respectively; and
a voltage control circuit arranged to prevent voltage fluctuation of one or both of the plurality of word lines and the plurality of bit lines, wherein
one or both of the plurality of word lines and the plurality of bit lines are connected to the voltage control circuit at a voltage control point positioned at a farthest point from a drive point at which the plurality of word lines are connected to the word line selection circuit or the plurality of bit lines are connected to the bit line selection circuit, or at a point in between the drive point and the farthest point,
when the voltage control circuit is connected to the plurality of word lines, the voltage control circuit connected to the unselected word lines to which the unselected word line voltage is applied is deactivated, the selected word line voltage being a the selected word line voltage and the selected bit line voltage, and
when the voltage control circuit is connected to the plurality of bit lines, the voltage control circuit connected to the unselected bit lines to which the unselected bit line voltage is applied is deactivated, the unselected bit line voltage being a voltage between the selected word fine voltage and the selected bit line voltage.

2. The nonvolatile semiconductor memory device according to claim 1, wherein
one ends of one or both of the plurality of word lines and the plurality of bit lines are connected to the word line selection circuit or the bit line selection circuit, and the other ends thereof are connected to the voltage control circuit.

3. The nonvolatile semiconductor memory device according to claim 1, wherein
the voltage control circuit includes a MOSFET and an inverter circuit,
one of a drain electrode and a source electrode of the MOSFET is connected to the vole control point and an input terminal of the inverter circuit, other of the drain electrode and the source electrode of the MOSFET is connected to a line to which a same voltage as that applied to the drive point is applied, and a gate electrode is connected to an out or terminal of the inverter circuit,
when the voltage control circuit is connected to the plurality of word lines, the voltage control circuit is deactivated in the following cases;
when the selected word line voltage is lower than the selected bit line voltage, and a voltage equal to or higher than a lower limited value lower than the unselected word line voltage is applied; and
when the selected word line voltage is higher than the selected bit line voltage, and a voltage equal to or lower than an upper limited value higher than the unselected word line voltage is applied, and when the voltage control circuit is connected to the plurality of bit lines, the voltage control circuit is deactivated in the following cases:
when the selected bit line voltage is lower than the selected word line voltage, and a voltage equal to or higher than a lower limited value lower than the unselected bit line voltage is applied; and
when the selected bit line voltage is higher than the selected word line voltage, and a voltage equal to or lower than an upper limited value higher than the unselected bit line voltage is applied.

4. A nonvolatile semiconductor memory device comprising:
a memory cell array having a plurality of two-terminal structured memory cells disposed in a row direction and a column direction, a plurality of word lines extending in the row direction, and a plurality of bit lines extending in the column direction, in which one ends of the memory cells in the same row are connected to a common word line and the other ends of the memory cells in the same column are connected to a common bit line;
a word line selection circuit selectin a redetermined number of word lines from the plurality of word lines as selected word lines, and applying a selected word line voltage and an unselected word line voltage to the selected word lines and unselected word lines, respectively;
a bit line selection circuit selecting a predetermined number of bit lines from the plurality of bit lines as selected bit lines, and applying a selected bit line voltage and an unselected bit line voltage to the selected bit lines and unselected bit lines, respectively; and
a voltage control circuit preventing voltage fluctuation of at least either one of the plurality of word lines and the plurality of bit lines, wherein
at least either one of the plurality of word lines and the plurality of bit lines are connected to the voltage control circuit at a voltage control point positioned at a farthest point from a drive point at which the plurality of word lines are connected to the word line selection circuit or the plurality of bit lines are connected to the bit line selection circuit or at a middle point between the drive point and the farthest point,
the voltage control circuit includes a series circuit having a diode circuit and a MOSFET, and an inverter circuit, and the diode circuit is arranged to prevent voltage fluctuation in a positive direction or a negative direction at the voltage control point from a predetermined control reference voltage,
the series circuit is connected between the voltage control point and a predetermined voltage supply line,
an input terminal of the inverter circuit is connected to a drain electrode or a source electrode of the MOSFET, whichever is on the side of the voltage control point, and
an output terminal of the inverter circuit is connected to a gate electrode of the MOSFET.

5. The nonvolatile semiconductor memory device according to claim 4, wherein the diode circuit includes a PN junction diode element.

6. The nonvolatile semiconductor memory device according to claim 4, wherein the diode circuit includes a MOSFET having the drain and gate which are connected to each other.

7. The nonvolatile semiconductor memory device according to claim 1, wherein
the memory cell has a two-terminal structure having a variable resistance element storing information by a change of an electric resistance, in which information can be programmed when an electric stress is applied across the variable resistance element and the electric resistance of the variable resistance element is changed, and when a predetermined program voltage is applied between the selected word line and the selected bit line connected to the memory cell to be programmed at the time of programming operation, in the case where the voltage control circuit is connected to the selected word line or the selected bit line, whichever is supplied with a higher voltage, the voltage control circuit prevents voltage fluctuation in a direction toward a low voltage at the voltage control point, or in the case where the voltage control circuit is connected to the selected word line or the selected bit line, whichever is supplied with a lower voltage, the voltage control circuit prevents voltage fluctuation in a direction toward a high voltage at the voltage control point.

8. The nonvolatile semiconductor memory device according to claim 1, wherein the memory cell has a two-terminal structure having a variable resistance element storing information by a change of an electric resistance, in which information can be programmed when an electric stress is applied across the variable resistance element and the electric resistance of the variable resistance element is changed, and the voltage control circuit is not activated at the time of reading operation of the memory cell.

9. The nonvolatile semiconductor memory device according to claim 1, wherein the voltage control circuit is arranged so as not to prevent fluctuation of a voltage applied to the unselected word lines and/or the unselected bit lines.

10. The nonvolatile semiconductor memory device according to claim 1, wherein one or both of the plurality of word lines and the plurality of bit lines are formed of a high melting point metal material, polycrystalline silicon, or a compound of the high melting point metal material and polycrystalline silicon.

11. The nonvolatile semiconductor memory device according to claim 1, wherein when the voltage control circuit is connected to the plurality of word lines, the voltage control circuit is deactivated in the following cases:

when the selected word line voltage is lower than the selected bit line voltage, and a voltage equal to or higher than a lower limited value lower than the unselected word line voltage is applied; and when the selected word line voltage is higher than the selected bit line voltage, and a voltage equal to or lower than an upper limited value higher than the unselected word line voltage is applied, and when the voltage control circuit is connected to the plurality of bit lines, the voltage control circuit is deactivated in the following cases:

when the selected bit line voltage is lower than the selected word line voltage, and a voltage equal to or higher than a lower limited value lower than the unselected bit line voltage is applied; and when the selected bit line voltage is higher than the selected word line voltage, and a voltage equal to or lower than an upper limited value higher than the unselected bit line voltage is applied.

12. The nonvolatile semiconductor memory device according to claim 11, wherein the unselected word line voltage is a half of the selected bit line voltage when the selected word line voltage is lower than the selected bit line voltage, and the unselected word line voltage is a half of the selected word line voltage when the selected word line voltage is higher than the selected bit line voltage.

13. A voltage control circuit arranged to control voltage fluctuations in a non-volatile memory device, the memory device comprising a plurality of word lines disposed in a first direction substantially parallel to each other, a plurality of bit lines disposed in a second direction substantially parallel to each other, the first and second directions being substantially perpendicular, and a plurality of two-terminal cells disposed at cross-points of the word and bit lines, the voltage control circuit comprising:

a word line voltage controller or a bit line voltage controller or both, wherein the word line voltage controller is arranged to control a voltage of each of one or more selected word lines selected by a word line decoder when a deviation of a voltage at a word line control point of a selected word line from a selected word line voltage is a predetermined selected word threshold or greater so that the voltage deviation is within the predetermined selected word threshold, and wherein the bit line voltage controller is arranged to control a voltage of each of one or more selected bit lines selected by a bit line decoder when a deviation of a voltage at a bit line control point of a selected bit line from a selected bit line voltage is a predetermined selected bit line threshold or greater so that the voltage deviation is within the predetermined selected bit line threshold.

14. The voltage control circuit according to claim 13, wherein the word line decoder applies selected word line voltages to the selected word lines at word line drive points of the word lines, when the word line drive points are located substantially at one ends of the word lines, the word line control points are located substantially at opposite ends of the word lines, and when the word line drive points are located substantially at both ends of the word lines, the word line control points are located substantially at mid points of the word lines, and wherein the bit line decoder applies selected bit line voltages to the selected bit lines at bit line drive points of the bit lines, when the bit line drive points are located substantially at one ends of the bit lines, the bit line control points are located substantially at opposite ends of the bit lines, and when the bit line drive points are located substantially at both ends of the bit lines, the bit line control points are located substantially at mid points of the bit lines.

15. The voltage control circuit according to claim 13, wherein the word line voltage controller comprises a plurality of word line control circuits each connected at the word line control point of a corresponding selected word line, wherein each word line control circuit comprises a diode whose anode is connected to the word line control point, an FET transistor whose drain is connected to a cathode of the diode and whose source is connected to a signal line to which the selected word line voltage is applied, and an inverter with an input connected to a gate of the WET transistor and an output connected to the word line control point, wherein the bit line voltage controller comprises a plurality of bit line control circuits each connected at the bit line control point of a corresponding selected bit line, wherein each bit line control circuit comprises a diode whose anode is connected to the bit line control point, an VET transistor with a source connected to an anode of the diode and a drain connected to a signal line to which the selected bit line voltage is applied, and an inverter with an input connected to a gate of the PET transistor and an output connected to the bit line control point.

16. The voltage control circuit according to claim 15, wherein the predetermined selected word threshold is set by adjusting a turn-on voltage of the diode of the word line control circuit, and wherein the predetermined selected bit threshold is set by adjusting a turn-on voltage of the diode of the bit line control circuit.

17. The voltage control circuit according to claim 13, wherein said word line voltage controller is arranged to activate to control a voltage of each selected word line when the voltage deviation of the voltage at the word line control point from the selected word line voltage is in a word line deviation range between a predetermined upper word line limit and a predetermined lower word line limit so that the voltage deviation is within the predetermined selected word threshold and is arranged to deactivate when the voltage deviation is outside the word line deviation range, and wherein said bit line voltage controller is arranged to activate to control a voltage of each selected bit line when the voltage deviation of the voltage at the bit line control point from the selected bit line voltage is in a bit line deviation range between a predetermined upper bit line limit and a predetermined lower bit line limit so that the voltage deviation is within the predetermined selected bit threshold and is arranged to deactivate when the voltage deviation is outside the bit line deviation range.

18. The voltage control circuit according to claim 17, wherein the word line voltage controller comprises a plurality of word line control circuits each connected at the word line control point of a corresponding selected word line, wherein each word line control circuit comprises a diode whose anode is connected to the word line control point, an PET transistor whose drain is connected to a cathode of the diode and whose source is connected to a signal line to which the selected word line voltage is applied, and an inverter with an input connected to a gate of the PET transistor and an output connected to the word line control point, wherein the bit line voltage controller comprises a plurality of bit line control circuits each connected at the bit line control point of a corresponding selected bit line, wherein each bit line control circuit comprises a diode whose anode is connected to the bit line control point, an FET transistor with a source connected to an anode of the diode and a drain connected to a signal line to which the selected bit line voltage is applied, and an inverter with an input connected to a gate of the FET transistor and an output connected to the bit line control point.

19. The voltage control circuit according to claim 18, wherein the predetermined lower word line limit is set by adjusting a turn-on voltage of the diode of the word line control circuit, wherein the predetermined upper word line limit is set by adjusting an input inversion level of the inverter of the word line control circuit, wherein the predetermined upper bit line limit is set by adjusting a turn-on voltage of the diode of the bit line control circuit, and wherein the predetermined lower bit line limit is set by adjusting an input inversion level of the inverter of the bit line control circuit.

\* \* \* \* \*